(12) United States Patent
Kang et al.

(10) Patent No.: US 11,374,570 B1
(45) Date of Patent: Jun. 28, 2022

(54) TRANSMITTER FOR TRANSMITTING A DUOBINARY SIGNAL

(71) Applicants: SK hynix Inc., Icheon (KR); RESEARCH & BUSINESS FOUNDATION SUNGKYUNKWAN UNIVERSITY, Suwon (KR)

(72) Inventors: Dongsuk Kang, Suwon (KR); Jaewoo Park, Incheon (KR); Jung-Hoon Chun, Suwon (KR); Kyu Dong Hwang, Icheon (KR); Dae Han Kwon, Icheon (KR)

(73) Assignees: SK hynix Inc., Icheon (KR); RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 0 days.

(21) Appl. No.: 17/395,288

(22) Filed: Aug. 5, 2021

(30) Foreign Application Priority Data

Apr. 5, 2021 (KR) .................. 10-2021-0043798

(51) Int. Cl.
| | | |
|---|---|---|
| *H03K 19/00* | (2006.01) | |
| *H03K 19/017* | (2006.01) | |
| *H03K 19/09* | (2006.01) | |
| *H03K 19/17772* | (2020.01) | |

(52) U.S. Cl.
CPC ....... *H03K 19/01742* (2013.01); *H03K 19/09* (2013.01); *H03K 19/17772* (2013.01)

(58) Field of Classification Search
CPC ............. H03K 19/01742; H03K 19/09; H03K 19/17772
See application file for complete search history.

(56) References Cited

U.S. PATENT DOCUMENTS

| | | | |
|---|---|---|---|
| 9,143,171 B1* | 9/2015 | Chang | H04L 12/12 |
| 2020/0007362 A1* | 1/2020 | Kim | H04L 25/4917 |
| 2020/0382121 A1* | 12/2020 | Jeong | G11C 11/4096 |
| 2021/0058280 A1* | 2/2021 | Lee | H04L 27/02 |

FOREIGN PATENT DOCUMENTS

| | | |
|---|---|---|
| KR | 202000041424 A | 4/2020 |
| KR | 20200137361 | 12/2020 |

* cited by examiner

*Primary Examiner* — Kurtis R Bahr

(57) ABSTRACT

A transmitter provides a duobinary signal corresponding to one of level 0, level 1, and level 2 based on first data and second data, and includes a pull-up driving circuit including a plurality of pull-up resistors selectively coupled between a first power source and a transmission node according to the first data and the second data; and a pull-down driving circuit including a plurality of pull-down resistors selectively coupled between the transmission node and a second power source, wherein at least one of the plurality of pull-up resistors is coupled between the first power source and the transmission node both when the first data is activated and when the second data is activated, or at least one of the plurality of pull-down resistors is coupled between the second power source and the transmission node both when the first data is activated and when the second data is activated.

8 Claims, 3 Drawing Sheets

<Prior Art>

TRANSMITTER FOR TRANSMITTING A DUOBINARY SIGNAL

CROSS-REFERENCE TO RELATED APPLICATION

The present application claims priority under 35 U.S.C. § 119(a) to Korean Patent Application No. 10-2021-0043798, filed on Apr. 5, 2021, which is incorporated herein by reference in its entirety.

BACKGROUND

1. Technical Field

Various embodiments generally relate to a transmitter for transmitting a duobinary signal.

2. Related Art

FIG. 1 illustrates a circuit diagram of a conventional transmitter 1.

The conventional transmitter 1 includes a pull-up driving circuit 10 and a pull-down driving circuit 20.

The pull-up driving circuit 10 is coupled between a first power source VDD and a transmission node Nt, and the pull-down driving circuit 20 is coupled between the transmission node Nt and a second power source GND.

The pull-up driving circuit 10 includes a first PMOS transistor MP1 and a first pull-up resistor RU1 that are coupled in series between the first power source VDD and the transmission node Nt.

First data D1 is input to a gate of the first PMOS transistor MP1.

The pull-up driving circuit 10 further includes a second PMOS transistor MP2 and a second pull-up resistor RU2 that are coupled in series between the first power source VDD and the transmission node Nt.

Second data D2 is input to a gate of the second PMOS transistor MP2.

The pull-down driving circuit 20 includes a first pull-down resistor RD1 and a first NMOS transistor MN1 that are coupled in series between the transmission node Nt and the second power source GND.

The first data D1 is input to a gate of the first NMOS transistor MN1.

The pull-down driving circuit 20 further includes a second pull-down resistor RD2 and a second NMOS transistor MN2 that are coupled in series between the transmission node Nt and the second power source GND.

The second data D2 is input to a gate of the second NMOS transistor MN2.

A channel 3 having a shape of a microstrip or the like is positioned between the transmission node Nt and a receiving node Nr.

A receiver 2 includes a termination resistor Rt coupled between the first power source VDD and the receiving node Nr.

In FIG. 1, a duobinary signal corresponds to level 2 when both the first data D1 and the second data D2 are at a low level, the duobinary signal corresponds to level 1 when only one of the first data D1 and the second data D2 is at a high level, and the duobinary signal corresponds to level 0 when both the first data D1 and the second data D2 are at the high level.

For example, it is assumed that resistance of the termination resistor Rt is 60Ω according to the standard of GDDR (Graphics Double Data Rate), resistance of each of the first and second pull-up resistors RU1 and RU2 is 120Ω so that total resistance of the first and second pull-up resistors RU1 and RU2 becomes 60Ω, and resistance of each of the first and second pull-down resistors RD1 and RD2 is 80Ω so that total resistance of the first and second pull-down resistors RD1 and RD2 becomes 40Ω according to the conventional duobinary transmitter standard.

A receiving voltage Vr at the receiving node Nr can be calculated through DC analysis.

According to the DC analysis, the receiving voltage Vr at the level 2 becomes VDD, the receiving voltage Vr at the level 1 becomes 2/3 VDD, and the receiving voltage Vr at the level 0 becomes 4/10 VDD.

Accordingly, an interval between the level 2 and the level 1 is 10/30 VDD, and an interval between the level 1 and the level 0 is 8/30 VDD, and thus the intervals between the three levels are not equal to each other.

As described above, in the conventional transmitter, the intervals between the three levels of the duobinary signal are not constant, and thus there is a problem that a large amount of bit errors occur during a reception operation.

SUMMARY

In accordance with an embodiment of the present disclosure, a transmitter configured to provide a duobinary signal corresponding to one of level 0, level 1, and level 2 based on a first data and a second data may include a pull-up driving circuit including a plurality of pull-up resistors selectively coupled between a first power source and a transmission node according to the first data and the second data; and a pull-down driving circuit including a plurality of pull-down resistors selectively coupled between the transmission node and a second power source, wherein at least one of the plurality of pull-up resistors is coupled between the first power source and the transmission node both when the first data is activated and when the second data is activated, or at least one of the plurality of pull-down resistors is coupled between the second power source and the transmission node both when the first data is activated and when the second data is activated.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 2:
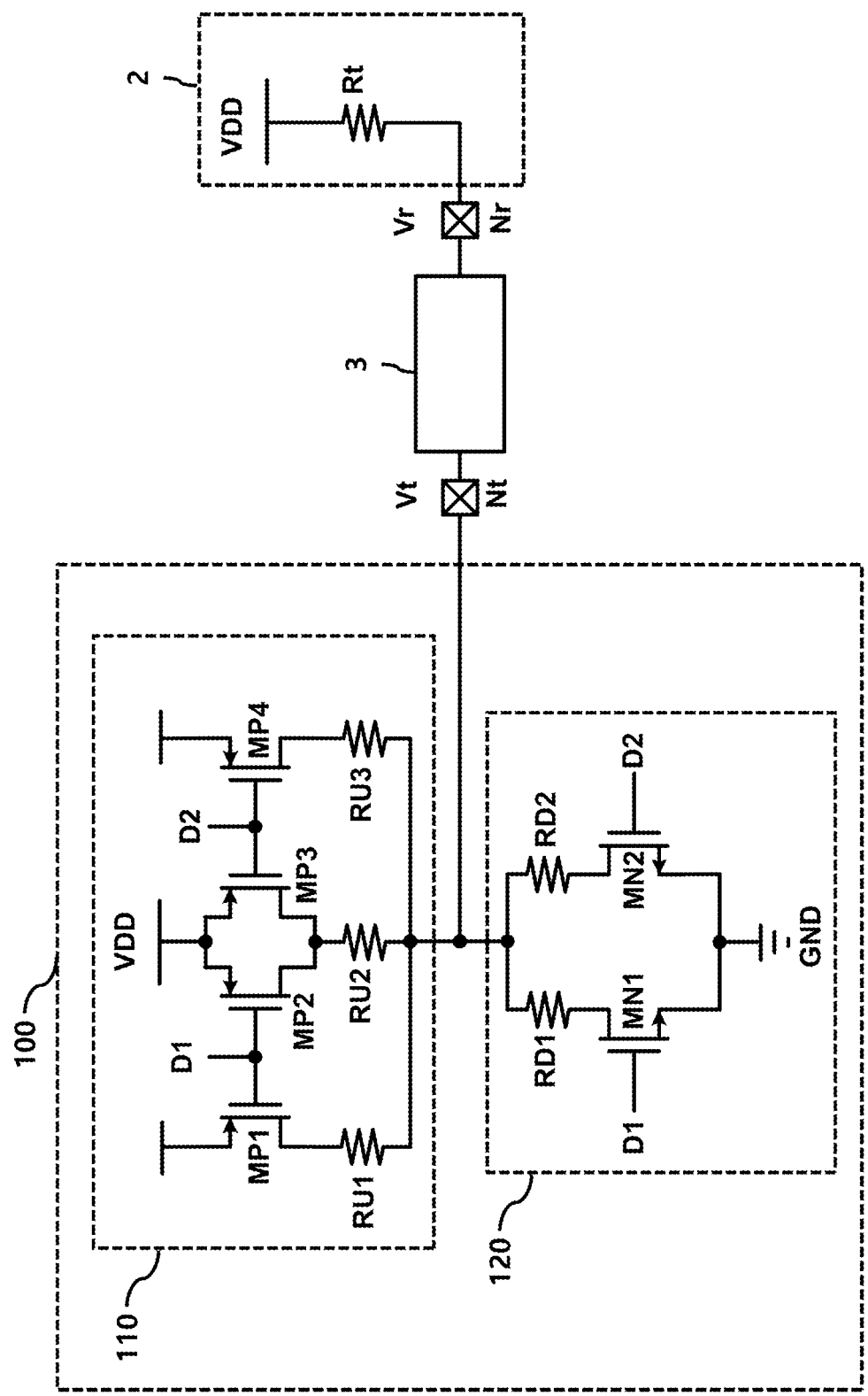
FIG. 2 illustrates a transmitter according to an embodiment of the present disclosure.

FIG. 2 is a circuit diagram showing a transmitter 100 according to an embodiment of the present disclosure.

The transmitter 100 includes a pull-up driving circuit 110 and a pull-down driving circuit 120.

The pull-up driving circuit 110 is coupled between a first power source VDD and a transmission node Nt, and the pull-down driving circuit 120 is coupled between the transmission node Nt and a second power source GND.

The pull-up driving circuit 110 includes a first PMOS transistor MP1 and a second PMOS transistor MP2 each having a gate to which first data D1 is input and a source coupled to the first power source VDD, and a third PMOS transistor MP3 and a fourth PMOS transistor MP4 each having a gate to which second data D2 is input and a source coupled to the first power source VDD.

The pull-up driving circuit 110 further includes a first pull-up resistor RU1 coupled between a drain of the first PMOS transistor MP1 and the transmission node Nt, a second pull-up resistor RU2 coupled between a common drain of the second PMOS transistor MP2 and the third PMOS transistor MP3 and the transmission node Nt, and a third pull-up resistor RU3 coupled between a drain of the fourth PMOS transistor MP4 and the transmission node Nt.

The pull-down driving circuit 120 includes a first pull-down resistor RD1 and a second pull-down resistor RD2 each having a first node coupled to the transmission node Nt.

The pull-down driving circuit 120 further includes a first NMOS transistor MN1 coupled between a second node of the first pull-down resistor RD1 and the second power source GND and having a gate to which the first data D1 is input.

The pull-down driving circuit 120 further includes a second NMOS transistor MN2 coupled between a second node of the second pull-down resistor RD2 and the second power source GND and having a gate to which the second data D2 is input.

A channel 3 having a shape of a microstrip or the like is positioned between the transmission node Nt and a receiving node Nr.

A receiver 2 includes a termination resistor Rt coupled between the first power supply VDD and the receiving node Nr.

In FIG. 2, a duobinary signal corresponds to level 2 when both the first data D1 and the second data D2 are at a low level, the duobinary signal corresponds to level 1 when only one of the first data D1 and the second data D2 is at the low level, and the duobinary signal corresponds to level 0 when both the first data D1 and the second data D2 are at a high level.

In this embodiment, it is assumed that resistance of the termination resistor Rt is 60Ω.

In this embodiment, resistance of the first pull-up resistor RU1 is the same as resistance of the third pull-up resistor RU3, and resistance of the first pull-down resistor RD1 is the same as resistance of the second pull-down resistor RD2.

Also, the resistance of the first pull-up resistor RU1 is different from resistance of the second pull-up resistor RU2.

Figure 1:
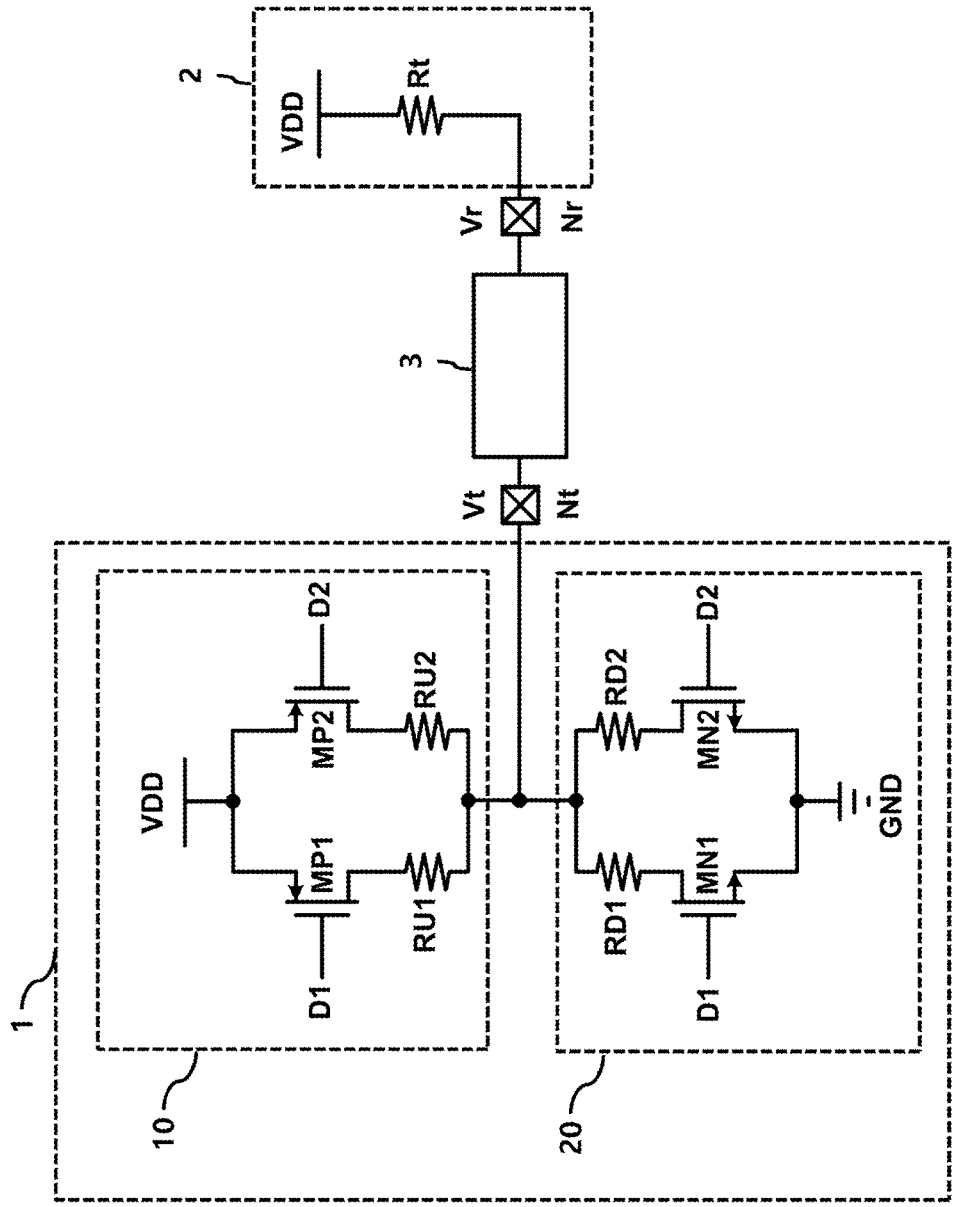
FIG. 1 illustrates a conventional transmitter.

Unlike the conventional transmitter 1 shown in FIG. 1, the transmitter 100 according to the present embodiment further includes the second pull-up resistor RU2 in the pull-up driving circuit 110. At the level 1, the second pull-up resistor RU2 is additionally coupled between the first power source VDD and the transmission node Nt, so that the intervals between the levels of the duobinary signal become equal to each other. That is, the level 1 is disposed in the middle of the level 0 and the level 2.

In this embodiment, the resistance of each of the first pull-up resistor RU1 and the third pull-up resistor RU3 is 240Ω and the resistance of the second pull-up resistor RU2 is 120Ω, making total pull-up resistance be 60Ω.

In addition, it is assumed that the resistance of each of the first pull-down resistor RD1 and the second pull-down resistor RD2 is 80Ω in order to make the total pull-down resistance be 40Ω.

A receiving voltage Vr of the receiving node Nr can be calculated through DC analysis.

In this embodiment, the receiving voltage Vr of the receiving node Nr at the level 2 is VDD, the receiving voltage Vr at the level 1 is 7/10 VDD, and the receiving voltage Vr at the level 0 is 4/10 VDD.

In this case, the interval between the level 2 and the level 1 and the interval between the level 1 and the level 0 are the same as 3/10 VDD.

As described above, in the present embodiment, by simply modifying the pull-up driving circuit 110, the interval between the level 2 and the level 1 of the duobinary signal can be equal to the interval between the level 1 and the level 0.

Figure 3:
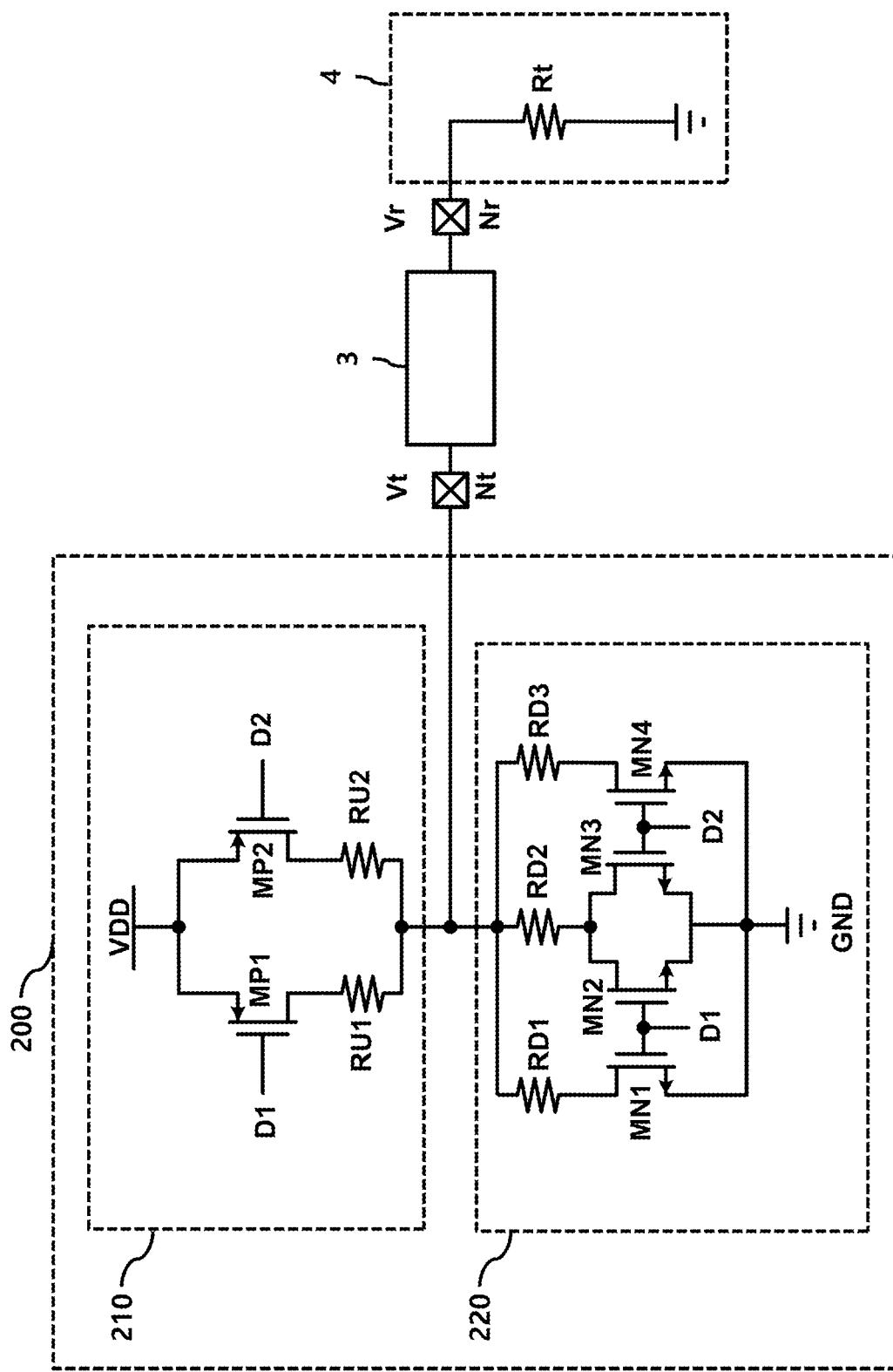
FIG. 3 illustrates a transmitter according to another embodiment of the present disclosure.

FIG. 3 is a circuit diagram showing a transmitter 200 according to another embodiment of the present disclosure.

The transmitter 200 includes a pull-up driving circuit 210 and a pull-down driving circuit 220.

The pull-up driving circuit 210 is coupled between a first power source VDD and the transmission node Nt, and the pull-down driving circuit 220 is coupled between the transmission node Nt and a second power source GND.

The pull-up driving circuit 210 includes a first pull-up resistor RU1 and a second pull-up resistor RU2 each having a first node coupled to a transmission node Nt.

The pull-up driving circuit 210 further includes a first PMOS transistor MP1 having a drain coupled to a second node of the first pull-up resistor RU1, a source coupled to the first power source VDD, and a gate receiving first data D1.

The pull-up driving circuit 210 further includes a second PMOS transistor MP2 having a drain coupled to a second node of the second pull-up resistor RU2, a source coupled to the first power source VDD, and a gate receiving second data D2.

The pull-down driving circuit 220 includes a first pull-down resistor RD1, a second pull-down resistor RD2, and a third pull-down resistor RD3 each having a first node coupled to the transmission node Nt.

The pull-down driving circuit 220 further includes a first NMOS transistor MN1 having a drain coupled to a second node of the first pull-down resistor RD1, a source coupled to the second power source GND, and a gate receiving the first data D1.

The pull-down driving circuit 220 further includes a second NMOS transistor MN2 having a drain coupled to a second node of the second pull-down resistor RD2, a source coupled to the second power source GND, and a gate receiving the first data D1.

The pull-down driving circuit 220 further includes a third NMOS transistor MN3 having a drain coupled to the second node of the second pull-down resistor RD2, a source coupled to the second power source GND, and a gate receiving the second data D2.

The pull-down driving circuit 220 further includes a fourth NMOS transistor MN4 having a drain coupled to a second node the third pull-down resistor RD3, a source coupled to the second power source GND, and a gate receiving the second data D2.

A channel 3 having a shape of a microstrip or the like is positioned between the transmission node Nt and a receiving node Nr.

A receiver 4 includes a termination resistor Rt connected between the second power source GND and the receiving node Nr.

In FIG. 3, a duobinary signal corresponds to level 2 when both the first data D1 and the second data D2 are at a low level, the duobinary signal corresponds to level 1 when only one of the first data D1 and the second data D2 is at a high level, and the duobinary signal corresponds to level 0 when both the first data D1 and the second data D2 are at the high level.

In the embodiment of FIG. 3, it is assumed that resistance of the termination resistor Rt is 60Ω.

In the embodiment of FIG. 3, resistance of the first pull-up resistor RU1 is the same as resistance of the second pull-up resistor RU2, and resistance of the first pull-down resistor RD1 is the same as resistance of the third pull-down resistor RD3.

Also, the resistance of the first pull-down resistor RD1 is different from resistance of the second pull-down resistor RD2.

Unlike the conventional transmitter 1 shown in FIG. 1, the transmitter 200 according to the present embodiment further includes the second pull-down resistor RD2 in the pull-down driving circuit 220. At the level 1, the second pull-down resistor RD2 is additionally coupled between the second power source GND and the transmission node Nt, so that the intervals between the levels of the duobinary signal become equal to each other. That is, the level 1 is disposed in the middle of the level 0 and the level 2.

In the embodiment of FIG. 3, it is assumed that resistance of each of the first pull-up resistor RU1 and the second pull-up resistor RU2 is 80Ω in order to make the total pull-up resistance be 40Ω.

In addition, it is assumed that resistance of each of the first pull-down resistor RD1 and the third pull-down resistor RD3 is 240Ω and resistance of the second pull-down resistor RD2 is 120Ω in order to make the total pull-down resistance be 60Ω.

A receiving voltage Vr of the receiving node Nr can be calculated through the DC analysis.

In the embodiment of FIG. 3, the receiving voltage Vr of the receiving node Nr at the level 2 is 6/10 VDD, the receiving voltage Vr at the level 1 is 3/10 VDD, and the receiving voltage Vr at the level 0 is 0.

In this case, the interval between the level 2 and the level 1 and the interval between the level 1 and the level 0 are the same as 3/10 VDD.

As described above, by simply modifying the pull-down driving circuit 220, the interval between the level 2 and the level 1 of the duobinary signal can be equal to the interval between the level 1 and the level 0.

Through this, in the present invention, the quality of a transmitted duobinary signal can be improved.

Although various embodiments have been illustrated and described, various changes and modifications may be made to the described embodiments without departing from the spirit and scope of the invention as defined by the following claims.

What is claimed is:

1. A transmitter configured to provide a duobinary signal corresponding to one of level 0, level 1, and level 2 based on first data and second data, the transmitter comprising:
   a pull-up driving circuit including a plurality of pull-up resistors selectively coupled between a first power source and a transmission node according to the first data and the second data; and
   a pull-down driving circuit including a plurality of pull-down resistors selectively coupled between the transmission node and a second power source,
   wherein the pull-up driving circuit includes:
   a first pull-up resistor coupled between the first power source and the transmission node according to the first data;
   a second pull-up resistor coupled between the first power source and the transmission node according to at least one of the first data or the second data; and
   a third pull-up resistor coupled between the first power source and the transmission node according to the second data.

2. The transmitter of claim 1, wherein the pull-up driving circuit further includes:
   a first transistor coupling the first pull-up resistor to the first power source in response to the first data;
   a second transistor coupling the second pull-up resistor to the first power source in response to the first data;
   a third transistor coupling the second pull-up resistor to the first power source in response to the second data; and
   a fourth transistor coupling the third pull-up resistor to the first power source in response to the second data.

3. The transmitter of claim 1, wherein the pull-down driving circuit includes:
   a first pull-down resistor coupled between the second power source and the transmission node according to the first data; and
   a second pull-down resistor coupled between the second power source and the transmission node according to the second data.

4. The transmitter of claim 3, wherein the pull-down driving circuit further includes:
   a first transistor coupling the first pull-down resistor to the second power source in response to the first data;
   a second transistor coupling the second pull-down resistor to the second power source in response to the second data.

5. A transmitter configured to provide a duobinary signal corresponding to one of level 0, level 1, and level 2 based on first data and second data, the transmitter comprising:
   a pull-up driving circuit including a plurality of pull-up resistors selectively coupled between a first power source and a transmission node according to the first data and the second data; and
   a pull-down driving circuit including a plurality of pull-down resistors selectively coupled between the transmission node and a second power source,
   wherein the pull-down driving circuit includes:
   a first pull-down resistor coupled between the second power source and the transmission node according to the first data;
   a second pull-down resistor coupled between the second power source and the transmission node according to at least one of the first data or the second data; and
   a third pull-down resistor coupled between the second power source and the transmission node according to the second data.

6. The transmitter of claim 5, wherein the pull-down driving circuit further includes:
- a first transistor coupling the first pull-down resistor to the second power source in response to the first data;
- a second transistor coupling the second pull-down resistor to the second power source in response to the first data;
- a third transistor coupling the second pull-down resistor to the second power source in response to the second data; and
- a fourth transistor coupling the third pull-down resistor to the second power source in response to the second data.

7. The transmitter of claim 5, wherein the pull-up driving circuit includes:
- a first pull-up resistor coupled between the first power source and the transmission node according to the first data; and
- a second pull-up resistor coupled between the first power source and the transmission node according to the second data.

8. The transmitter of claim 7, wherein the pull-up driving circuit further includes:
- a first transistor coupling the first pull-up resistor to the first power source in response to the first data;
- a second transistor coupling the second pull-up resistor to the first power source in response to the second data.

* * * * *